(12) United States Patent
Holland

(10) Patent No.: US 11,355,898 B2
(45) Date of Patent: Jun. 7, 2022

(54) LASER DIODE ARRAY

(71) Applicant: BAE Systems plc, London (GB)

(72) Inventor: Graham Andrew Holland, Preston (GB)

(73) Assignee: BAE Systems plc, London (GB)

(*) Notice: Subject to any disclaimer, the term of this patent is extended or adjusted under 35 U.S.C. 154(b) by 0 days.

(21) Appl. No.: 16/649,773

(22) PCT Filed: Oct. 16, 2018

(86) PCT No.: PCT/GB2018/052975
§ 371 (c)(1),
(2) Date: Mar. 23, 2020

(87) PCT Pub. No.: WO2019/086833
PCT Pub. Date: May 9, 2019

(65) Prior Publication Data
US 2020/0280167 A1  Sep. 3, 2020

(30) Foreign Application Priority Data
Oct. 30, 2017  (GB) ..................................... 1717795

(51) Int. Cl.
*H01S 5/024* (2006.01)
*H01S 5/042* (2006.01)
(Continued)

(52) U.S. Cl.
CPC ........ *H01S 5/02423* (2013.01); *H01S 5/0427* (2013.01); *H01S 5/4031* (2013.01); *H01S 5/42* (2013.01); *H01S 5/02476* (2013.01)

(58) Field of Classification Search
None
See application file for complete search history.

(56) References Cited

U.S. PATENT DOCUMENTS 4,901,330 A * 2/1990 Wolfram ................. H01S 5/405
372/75
5,495,490 A    2/1996 Rice
(Continued)

FOREIGN PATENT DOCUMENTS

CN  102638002 A     8/2012
EP  1324440 A2      7/2003
GB  2499302 A  *    8/2013  .............. H01S 3/07

OTHER PUBLICATIONS

PCT Search Report for Appl No. PCT/GB2018/052975 dated Dec. 12, 2018, 19 Pages.
(Continued)

*Primary Examiner* — Tod T Van Roy
(74) *Attorney, Agent, or Firm* — Maine Cernota & Rardin

(57) ABSTRACT

A laser diode array (102) comprising a plurality of laser diodes (201-210) and a channel (212) proximate to each of the laser diodes (201-210), the channel (212) configured to receive and provide a passage for a flow of a fluid coolant; wherein the laser diodes (201-210) are configured to emit electromagnetic radiation having the same centre wavelength at different respective junction temperatures. A coolant supply system (104) coupled to the laser diode array (102) may cause coolant to flow through the channel (212). A flow rate of the coolant through the channel (212) may be controlled based on temperature measurements of the coolant prior to entering, within, and/or after exiting the laser diode array (102).

6 Claims, 1 Drawing Sheet

(51) Int. Cl.
*H01S 5/42* (2006.01)
*H01S 5/40* (2006.01)

(56) References Cited

U.S. PATENT DOCUMENTS

| | | | |
|---|---|---|---|
| 5,838,712 A | 11/1998 | Kraenert et al. | |
| 6,038,242 A * | 3/2000 | Yamamoto | H01S 5/4025 |
| | | | 372/20 |
| 8,364,320 B2 * | 1/2013 | Guggenmos | H01S 5/024 |
| | | | 700/282 |
| 10,951,004 B2 * | 3/2021 | Nagahara | H01S 5/02461 |
| 2005/0030988 A1 * | 2/2005 | Nolan | H01S 5/02423 |
| | | | 372/35 |
| 2005/0047456 A1 | 3/2005 | Rice | |
| 2008/0123705 A1 * | 5/2008 | Schleuning | H01S 5/024 |
| | | | 372/36 |
| 2008/0192206 A1 * | 8/2008 | Takagi | H01S 5/0233 |
| | | | 353/28 |
| 2008/0205459 A1 * | 8/2008 | Yonekubo | H04N 9/3129 |
| | | | 372/26 |
| 2011/0150026 A1 * | 6/2011 | Tsunekane | F02P 23/04 |
| | | | 372/75 |
| 2012/0093184 A1 * | 4/2012 | Krishnamoorthy | H01S 5/0261 |
| | | | 372/36 |
| 2013/0148679 A1 * | 6/2013 | Schleuning | H01S 5/06825 |
| | | | 372/38.06 |
| 2016/0254639 A1 * | 9/2016 | Watanabe | H01S 5/4087 |
| | | | 372/36 |
| 2016/0377822 A1 * | 12/2016 | Zheng | H01S 5/02453 |
| | | | 385/14 |
| 2020/0227895 A1 * | 7/2020 | Takigawa | H01S 5/3201 |

OTHER PUBLICATIONS

Great Britain Search Report for Appl No. GB1717795.7 dated Apr. 18, 2018, 3 Pages.
International Bureau of Wipo, International Preliminary Report dated May 14, 2020 for U.S. Appl. No. 16/649,773, 7 pages, Geneva, Switzerland.

* cited by examiner

LASER DIODE ARRAY

RELATED APPLICATIONS

This application is a national phase application filed under 35 USC § 371 of PCT Application No. PCT/GB2018/052975 with an International filing date of Oct. 16, 2018, which claims priority of GB Patent Application 1717795.7 filed Oct. 30, 2017. Both of these applications are incorporated by reference in their entirety for all purposes.

FIELD OF THE INVENTION

The present invention relates to laser diodes and arrays thereof, and further relates to the cooling of laser diodes and laser diode arrays.

BACKGROUND

Laser radiation has many applications, including in scientific, military, medical, and commercial fields.

Laser diodes may be used to provide this laser radiation. Laser diodes are electrically pumped semiconductor lasers. Typically, laser diodes comprise a semiconductor material manufactured to have a p-n junction thereby to provide an active laser medium. Examples of the semiconductor materials that may provide the active laser media include, but are not limited to, gallium arsenide (GaAs), indium gallium arsenide (InGaAs), and gallium nitride (GaN).

Laser diodes tend to be smaller, more compact, more reliable, and more efficient at converting electrical energy into laser energy compared to conventional lasers. Laser diodes also tend to have faster responses to control signals and be easier to fabricate than conventional lasers.

However, laser diodes operated at high average powers tend to generate high levels of heat in small volumes. Thus, temperatures of the laser diodes tend to rise. In laser diodes, high temperatures may cause negative effects including, but not limited to, efficiency reductions, wavelength shift, and damage to the diode package.

Conventionally, to maintain the temperature of laser diodes at an acceptable, relatively low level, use of laser diodes may be limited to applications requiring low average power, or laser diodes may be operated in a pulsed mode. It is known to provide cooling to laser diodes to achieve higher duty cycles.

SUMMARY OF THE INVENTION

In a first aspect, the present inventive provides a laser diode array comprising a plurality of laser diodes and a channel proximate to each of the laser diodes. The channel is configured to receive and provide a passage for a flow of a fluid coolant. The laser diodes are configured to emit electromagnetic radiation having the same centre wavelength at different respective junction temperatures.

The channel may comprise an inlet into which the fluid coolant may flow. The channel may comprise an outlet from which the fluid coolant may flow. The laser diodes may be spaced apart along the channel between the inlet and the outlet.

The laser diodes may be uniformly spaced apart.

The laser diode array may further comprise one or more temperature sensors operatively coupled to the channel and configured to measure a temperature of the fluid coolant in the channel.

In a further aspect, the present invention provides a system comprising a laser diode array according to any preceding aspect, and a coolant supply system coupled to the laser diode array and configured to cause a fluid coolant to flow through the channel of the laser diode array.

So-called "temperature deltas" for each respective laser diode may be substantially equal to each other, wherein a temperature delta for a laser diode is the difference between a casing temperature of that laser diode and a temperature of the coolant at that laser diode.

The system may further comprise a first temperature sensor configured to measure a temperature of the fluid coolant input to the laser diode array. The coolant supply system may be configured to control a supply of the fluid coolant to the laser diode array dependent on sensor measurements by the first temperature sensor. The coolant supply system may be configured to, using sensor measurements by the first temperature sensor, supply the fluid coolant to the laser diode array, the supplied fluid coolant having a temperature substantially equal to (or below) the junction temperature a laser diode that is closest to a coolant inlet of the laser diode array.

The system may further comprise a second temperature sensor configured to measure a temperature of the fluid coolant output from the laser diode array. The coolant supply system may be configured to control a supply of the fluid coolant to the laser diode array dependent on sensor measurements by the second temperature sensor. The coolant supply system may be configured to, using sensor measurements by the second temperature sensor, control a flow rate of the fluid coolant to the laser diode such that the temperature of the coolant output from the laser diode array is substantially equal to (or below) the junction temperature of a laser diode that is closest to a coolant outlet of the laser diode array.

In a further aspect, the present invention provides a laser diode array comprising a plurality of laser diodes and a channel proximate to each of the laser diodes, the channel configured to receive and provide a passage for a flow of a fluid coolant, wherein each laser diodes is configured to emit light with the same centre wavelength as each of the other laser diodes, and each laser diode is configured to emit the light at the centre wavelength at a different junction temperature to each of the other laser diodes.

In a further aspect, the present invention provides a vehicle (e.g. an aircraft) comprising a laser diode array or system according to any preceding aspect.

In a further aspect, the present invention provides a method for cooling a laser diode array. The laser diode array comprises a plurality of laser diodes and a channel proximate to each of the laser diodes. The channel is configured to receive and provide a passage for a flow of a fluid coolant. The laser diodes are configured to emit electromagnetic radiation having the same centre wavelength at different respective junction temperatures. The method comprises causing, by a coolant supply system coupled to the laser diode array, a fluid coolant to flow through the channel of the laser diode array.

The method may further comprise measuring one or more temperatures selected from the group of temperatures consisting of: a temperature of the fluid coolant input to the laser diode array, a temperature of the fluid coolant within the laser diode array, and a temperature of the fluid coolant output from the laser diode array, and controlling the supply of fluid coolant to the laser diode array dependent on the one or more measured temperatures.

DETAILED DESCRIPTION

Figure 1:
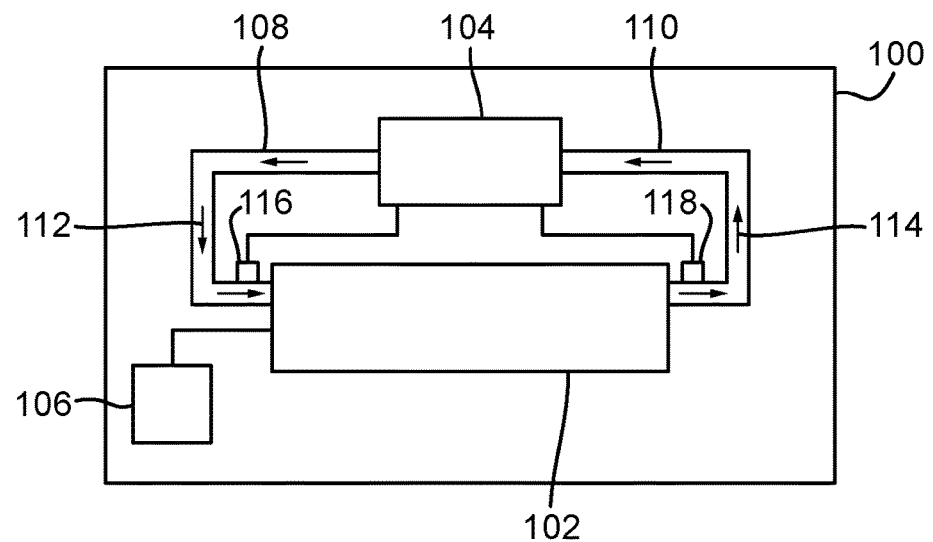
FIG. 1 is a schematic illustration (not to scale) of an example aircraft 100 on which an embodiment of a laser diode array 102 and cooling system therefor is implemented.

FIG. 1 is a schematic illustration (not to scale) of an example aircraft 100 on which an embodiment of a laser diode array 102 and cooling system therefor is implemented.

The aircraft 100 comprises the laser diode array 102, a coolant circulation system 104, and an electric current source 106.

The laser diode array 102 is described in more detail later below with reference to FIG. 2.

The coolant circulation system 104 is configured to circulate a coolant, such as water, through the laser diode array 102. The coolant circulation system 104 is coupled to the laser diode array 102 via a coolant inlet tube 108 and a coolant outlet tube 110. The coolant circulation system 104 may be considered to be a coolant supply for the laser diode array 102.

The coolant circulation system 104 comprises a coolant pump. In operation, the coolant circulation system 104 pumps coolant to the laser diode array 102 via the inlet tube 108, as indicated in FIG. 1 by arrows and the reference numeral 112. This coolant is then pumped through the laser diode array 102 thereby to cool the laser diode array 102, as described in more detail later below with reference to FIG. 2. After having passed through the laser diode array 102, the coolant returns to the coolant circulation system 104 via the outlet tube 110, as indicated in FIG. 1 by arrows and the reference numeral 114.

The coolant circulation system 104 further comprises a heat exchanger arranged to cool the coolant returned from the laser diode array 102 prior to that coolant being recirculated to the laser diode array 102.

The coolant circulation system 104 is configured to measure the temperature of the coolant in the inlet tube 108 using a first temperature sensor 116 coupled to the inlet tube 108. Preferably, the first temperature sensor 116 is located at or proximate to an inlet of the laser diode array 102.

The coolant circulation system 104 is configured to measure the temperature of the coolant in the outlet tube 110 using a second temperature sensor 118 coupled to the outlet tube 110. Preferably, the second temperature sensor 118 is located at or proximate to an outlet of the laser diode array 102.

The coolant circulation system 104 is configured to control the flow rate of the coolant through the inlet tube 108, laser diode array 102, and the outlet tube 110, for example as described in more detail later below. The coolant circulation system 104 may control the flow rate of the coolant using the measurements of the temperature of the coolant in the inlet tube 108 and/or outlet tube.

The electric current source 106 is configured to provide electric current to the laser diode array 102, thereby to power the laser diode array 102. The electric current source 106 may be a conventional electric current source.

Figure 2:
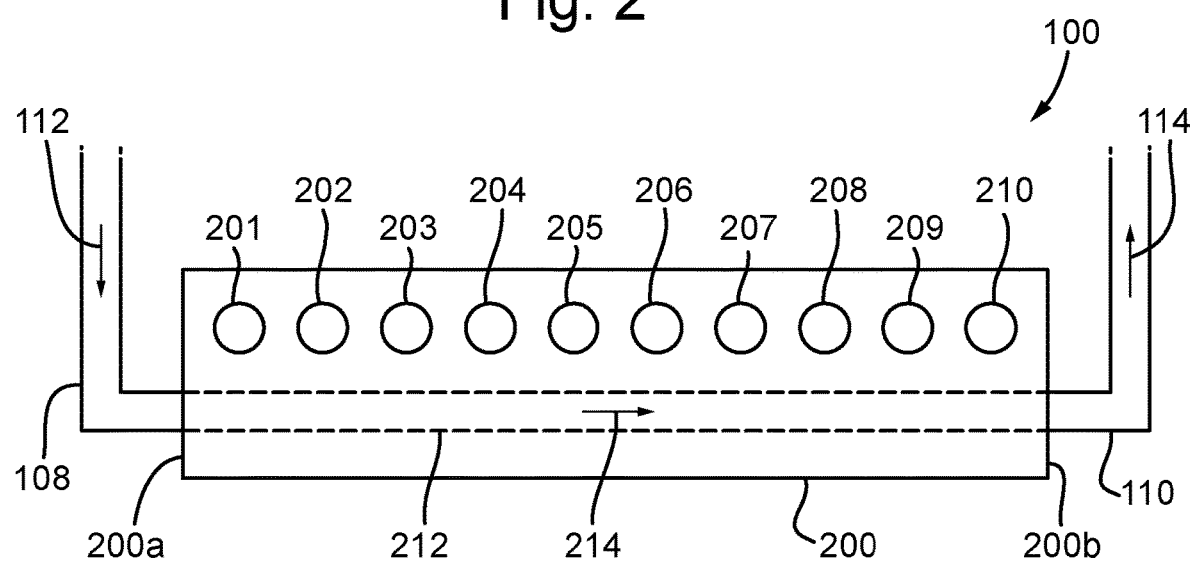
FIG. 2 is a schematic illustration (not to scale) showing further details of an embodiment of the laser diode array 102.

FIG. 2 is a schematic illustration (not to scale) showing further details of an embodiment of the laser diode array 102.

In this embodiment, the laser diode array 102 comprises a housing 200 (i.e. a casing) and a plurality of laser diodes 201-210.

In this embodiment, the laser diode array 102 comprises ten laser diodes 201-210, namely a first laser diode 201, a second laser diode 202, a third laser diode 203, a fourth laser diode 204, a fifth laser diode 205, a sixth laser diode 206, a seventh laser diode 207, an eighth laser diode 208, a ninth laser diode 209, and a tenth laser diode 210. The laser diodes 201-210 may be any appropriate type of laser diodes, for example, double heterostructure lasers, quantum well lasers, quantum cascade lasers, interband cascade lasers, separate confinement heterostructure lasers, distributed Bragg Reflector lasers, distributed feedback lasers, vertical-cavity surface-emitting lasers (VCSELs), vertical external-cavity surface-emitting lasers (VECSELs), and external-cavity diode lasers. In some embodiments, the plurality of laser diodes 201-210 comprises multiple different types of laser diode.

In this embodiment, the housing 200 secures together the plurality of laser diodes 201-210. The laser diodes 201-210 are secured together in a side-by-side arrangement to form a row or stack of laser diodes. The row of laser diodes 201-210 extends from a first end 200a of the housing 200 to a second end 200b of the housing 200, the second end 200b being opposite to the first end 202a. In this embodiment, the laser diodes 201-210 are substantially uniformly spaced apart, i.e. the spacings between each pair of adjacent laser diodes are substantially equal to each other. In this embodiment, the laser diodes 201-210 are arranged in the following order from the first end 200a to the second end 200b: the first laser diode 201, the second laser diode 202, the third laser diode 203, the fourth laser diode 204, the fifth laser diode 205, the sixth laser diode 206, the seventh laser diode 207, the eighth laser diode 208, the ninth laser diode 209, and the tenth laser diode 210.

The housing 200 comprises a through channel 212. The through channel 212 extends through the housing 200 from the first end 200a to the second end 200b. At the first end 200a, the through channel 212 is connected to the inlet tube 108. At the second end 200b, the through channel 212 is connected to the outlet tube 110. The through channel 212 is proximate to the laser diodes 201-210 such that coolant flowing through the through channel 212 provides cooling to those laser diodes 201-210. In use, to cool the laser diodes 201-210, coolant flows through, in turn, through the inlet tube 108 (indicated by arrow 112), through the through channel 212 (indicated by arrow 214), and through the outlet tube 110 (indicated by arrow 114). As the coolant flows through the through channel 212, heat is transferred from the laser diodes 201-210 to the coolant. The coolant cools the laser diodes 201-210 in series.

In this embodiment, the electric current source 106 applies the same drive current to each of the laser diodes 201-210. The common drive current may be between, for example about 10's of milli-amps (mA) to 10's of amps (A), e.g. 10 mA to 1 A, e.g. 0.3 A to 0.5 A. in some embodiments, the laser diodes 201-210 may be driven at a voltage of about 1.7 Vdc.

In this embodiment, each laser diode 201-210 is configured to have the same centre wavelength at a different respective junction temperature. The centre wavelength of a laser diode may be considered to be the power-weighted mean wavelength emitted by that laser diode (for a given operating temperature and drive current). The centre wavelength of a laser diode may be considered to be a nominal operating wavelength of that laser diode.

In other words, each laser diode 201-210 may emit a narrow range of wavelengths of light. The power-weighted mean of the range of wavelengths emitted by a laser diode 201-210 may be regarded as the centre wavelength of that laser diode. The centre wavelength of a laser diode 201-210 may be the wavelength from range of wavelengths emitted by that laser diode 201-210 that corresponds to the highest output power.

In this embodiment, the first laser diode 201 is configured to produce the centre wavelength at a first junction temperature. Also, the second laser diode 202 is configured to produce the centre wavelength at a second junction temperature. The second junction temperature is higher than the first junction temperature. Also, the third laser diode 203 is configured to produce the centre wavelength at a third junction temperature. The third junction temperature is higher than the second junction temperature. Also, the fourth laser diode 204 is configured to produce the centre wavelength at a fourth junction temperature. The fourth junction temperature is higher than the third junction temperature. Also, the fifth laser diode 205 is configured to produce the centre wavelength at a fifth junction temperature. The fifth junction temperature is higher than the fourth junction temperature. Also, the sixth laser diode 206 is configured to produce the centre wavelength at a sixth junction temperature. The sixth junction temperature is higher than the fifth junction temperature. Also, the seventh laser diode 207 is configured to produce the centre wavelength at a seventh junction temperature. The seventh junction temperature is higher than the sixth junction temperature. Also, the eighth laser diode 208 is configured to produce the centre wavelength at an eighth junction temperature. The eighth junction temperature is higher than the seventh junction temperature. Also, the ninth laser diode 208 is configured to produce the centre wavelength at a ninth junction temperature. The ninth junction temperature is higher than the eighth junction temperature. Also, the tenth laser diode 210 is configured to produce the centre wavelength at a tenth junction temperature. The tenth junction temperature is higher than the ninth junction temperature.

In this embodiment, each laser diode 201-210 comprises a respective casing (which may include, for example, a heat sink or heat exchanger) via which heat may be transferred from the laser diode 201-210 to the coolant flowing through the through channel 212.

A difference between a temperature of a casing (e.g. a temperature of the heat sink or heat exchanger of that casing) of a laser diode 201-210 and a temperature of the coolant at or proximate to that laser diode 201-210 may be referred to as a "temperature delta". Preferably, the respective temperature deltas for the laser diodes 201-210 are all substantially equal to each other, or within a threshold range of each other. In some embodiments, the respective temperature deltas for the laser diodes 201-210 are all substantially equal to a predetermined value, or within a predetermined temperature range.

By way of example, in some embodiments, using a common drive current, the first laser diode 201 is configured such that its centre wavelength is 800 nm when operating at a casing temperature of 20° C. The casing temperature of a laser diode tends to be proportional to a junction temperature of that laser diode. Also, the second laser diode 202 is configured such that its centre wavelength is 800 nm when operating at a casing temperature of 21° C. (using the common drive current). Also, the third laser diode 203 is configured such that its centre wavelength is 800 nm when operating at a casing temperature of 22° C. (using the common drive current). Also, the fourth laser diode 204 is configured such that its centre wavelength is 800 nm when operating at a casing temperature of 23° C. (using the common drive current). Also, the fifth laser diode 205 is configured such that its centre wavelength is 800 nm when operating at a casing temperature of 24° C. (using the common drive current). Also, the sixth laser diode 206 is configured such that its centre wavelength is 800 nm when operating at a casing temperature of 25° C. (using the common drive current). Also, the seventh laser diode 207 is configured such that its centre wavelength is 800 nm when operating at a casing temperature of 26° C. (using the common drive current). Also, the eighth laser diode 208 is configured such that its centre wavelength is 800 nm when operating at a casing temperature of 27° C. (using the common drive current). Also, the ninth laser diode 209 is configured such that its centre wavelength is 800 nm when operating at a casing temperature of 28° C. (using the common drive current). Also, the tenth laser diode 210 is configured such that its centre wavelength is 800 nm when operating at a casing temperature of 29° C. (using the common drive current).

In this embodiment, the coolant circulation system 104 is configured to measure the temperature of the coolant in the inlet tube 108 (i.e. the coolant being supplied to the laser diode array 102). The coolant circulation system 104 may use this measurement of the coolant in the inlet tube 108 to control coolant supply so as to provide that the coolant at the first end 200a of the laser diode array 102 is at a temperature that cools the first laser diode 201 to about the first temperature. For example, the circulation system 104 uses measurements of the temperature of the coolant in the inlet tube 108 to control the coolant supply such that the coolant in the inlet tube 108 has a temperature about equal to the desired casing temperature of the first laser diode 201, e.g. 20° C.+/−1° C. The coolant circulation system 104 may use the measurement of the temperature of the coolant in the inlet tube 108 to control a flow rate of the coolant.

In this embodiment, the coolant circulation system 104 is configured to measure the temperature of the coolant in the outlet tube 110 (i.e. the coolant being received from the laser diode array 102). The coolant circulation system 104 may use this measurement of the coolant in the outlet tube 110 to control a flow rate of the coolant through the system 108, 212, 110.

Varying the flow rate of the coolant through the tube 108, the through channel 212, and outlet tube 110 tends to cause a temperature of the coolant in the outlet tube (i.e. the coolant output from the laser diode array 102) to vary (for constant output power or thermal load of the laser diode array). In particular, slower flow rates of the coolant tend to correspond to higher coolant temperatures in the outlet tube 110, since a given volume of coolant spends more time in the laser diode array 102 and thus more heat is transferred to that given volume of coolant. On the other hand, faster flow rates of the coolant tend to correspond to lower coolant temperatures in the outlet tube 110, since a given volume of coolant spends less time in the laser diode array 102 and thus less heat is transferred to that given volume of coolant.

The coolant circulation system 104 may use the measurement of the coolant in the outlet tube 108 to control the coolant flow rate so as to provide that the coolant at or proximate the second end 200b of the laser diode array 102 is at a temperature that cools the tenth laser diode 210 to about the tenth temperature (e.g. substantially equal to the tenth temperature). For example, the circulation system 104 uses measurements of the temperature of the coolant in the outlet tube 110 to control the coolant flow rate such that the coolant in the outlet tube 110 has a temperature of about 29° C., e.g. 29° C.+1-1° C. For example, if the measured temperature of the coolant in the outlet tube 108 is too high (e.g. about 30° C. or more), the coolant circulation system 104 may increase the coolant flow rate, thereby causing a reduction in the temperature of the coolant in the outlet tube 108. Similarly, if the measured temperature of the coolant in the outlet tube 108 is too low (e.g. about 28° C. or less), the coolant circulation system 104 may decrease the coolant flow rate, thereby causing an increase in the temperature of the coolant in the outlet tube 108.

In some embodiments, the coolant circulation system 104 compares the measurement of the coolant in the outlet tube 108 to a threshold temperature (or a threshold range of temperatures), and controls the coolant flow rate dependent on that comparison. For example, if the measured temperature of the coolant in the outlet tube 108 is above the threshold (or threshold range), the coolant flow rate may be increased. Similarly, if the measured temperature of the coolant in the outlet tube 108 is below the threshold (or threshold range), the coolant flow rate may be decreased. The threshold temperature may be equal to the desired casing temperature of the tenth laser diode 210 (e.g. 29° C.). A threshold range may be a range that includes the desired casing temperature of the tenth laser diode 210, e.g. 29° C.+/−2° C., or 29° C.+/−1° C., etc.

The coolant circulation system 104 may control the coolant flow rate based on a power demand, an output power, and/or a thermal load of the laser diode array. For example, a power demand, an output power, and/or a thermal load of the laser diode array may be measured, and the coolant flow rate controlled based on that measurement. For example, if the power demand of the laser diode array is increased, the coolant flow rate may be increased to provide increased coolant to the laser diodes.

Advantageously, controlling the coolant supply temperature and flow rate such that coolant input to the laser diode array 102 is substantially equal to the desired casing temperature of the first laser diode 201 and such that coolant output from the laser diode array 102 is substantially equal to the desired casing temperature of the last (tenth) laser diode 210, the intermediate laser diodes 202-209 tend to be cooled to their respective desired operating temperatures.

In particular, in this embodiment, coolant input to the laser diode array 102 being at about the desired casing temperature of the first laser diode 201 (e.g. about 20° C.) tends to cool the first laser diode 201 to about the first temperature. Heat is transferred from the first laser diode 201 to the coolant, thereby raising the temperature of the coolant to about the desired casing temperature of the second laser diode 202 (e.g. about 21° C.). This heated coolant flows to the second laser diode 202, and cools the second laser diode 202 to about the second temperature. Heat is transferred from the second laser diode 202 to the coolant, thereby raising the temperature of the coolant to about the desired casing temperature of the third laser diode 203 (e.g. about 22° C.). This heated coolant flows to the third laser diode 203, and cools the third laser diode 203 to about the third temperature, and so on until the coolant cools the tenth laser diode 210 to about the tenth temperature.

The above-described system implements a feedback loop in which an output coolant temperature is used to control a flow rate at which coolant is input to the laser diode array.

In some conventional laser diode arrays, all of the laser diodes are configured to produce radiation at the same centre wavelength (e.g. 800 nm) when operating at the same junction temperature (e.g. about 20° C.). For example, all of the laser diodes may be substantially the same. In such conventional systems, if the diodes were to be cooled in series, relatively high coolant flow rates would tend to be required to cool all of the diodes to within a threshold range of the desired junction temperature (e.g. to cool all of the diodes to 20° C.+/−2° C.). Advantageously, using laser diodes that produce the desired centre wavelength at different respective junction (or casing) temperatures tends to provide that relatively slower coolant flow rates may be used to cool the laser diodes to their respective preferred operating temperatures. These slower coolant flow rates tend to allow for use of a smaller coolant pump and coolant tubes. Thus, overall weight of the systems tends to be reduced. This tends to be particularly beneficial for aircraft.

Advantageously, effective cooling of the laser diode array is provided, which tends to allow for a higher intensity output compared to conventional systems.

The above-described method and apparatus tends to facilitate continuous operation of the laser diode. Limiting use of the laser diode to relatively low average power uses, or pulsed mode operation tends to be avoided.

Advantageously, the above-described laser diode and its cooling means may be provided in a thin, easily constructed package that can be closely stacked in an array of laser diodes.

The above-described method and apparatus tend to reduce or eliminate unwanted shifts in wavelength of output light. Furthermore, growth of defects in the laser diodes resulting from high temperatures tends to be reduced or eliminated, thereby improving efficiency of the laser diodes. Lifetime of the laser diodes tend to be reduced or eliminated.

Apparatus, including coolant circulation system 104, for implementing the above arrangement, and performing the above-described control of the coolant, may be provided by configuring or adapting any suitable apparatus, for example one or more computers or other processing apparatus or processors, and/or providing additional modules. The apparatus may comprise a computer, a network of computers, or one or more processors, for implementing instructions and using data, including instructions and data in the form of a computer program or plurality of computer programs stored in or on a machine readable storage medium such as computer memory, a computer disk, ROM, PROM etc., or any combination of these or other storage media.

In the above embodiments, the laser diode array and cooling system is implemented on an aircraft. However, in other embodiments the laser diode array and cooling system is not implemented on an aircraft. For example, the laser diode array and cooling system may be implemented on or in a different entity, such as a different type of vehicle.

In the above embodiments, the laser diode array comprises a single through channel through which coolant is caused to flow. However, in other embodiments, the laser diode array comprises a plurality of coolant channel through which coolant is caused to flow. The coolant channel may be separate, independent channels within the laser diode array. Alternatively, multiple channels may connect together within the laser diode array to allow the flow of coolant therebetween.

In the above embodiments, the laser diodes are cooled in series. However, in other embodiments, two or more of the laser diodes are cooled in parallel.

In the above embodiments, the laser diode array comprises ten laser diodes. However, in other embodiments, the laser diode array comprises a different number of laser diodes, for example more than ten laser diodes.

In the above embodiments, the laser diodes are arranged in a side-by-side arrangement to define a substantially straight row of laser diodes. However, in other embodiments the laser diodes are arranged in a different appropriate pattern, for example a non-straight row of laser diodes.

In the above embodiments, the laser diodes are uniformly spaced apart. However, in other embodiments, the laser diodes are not uniformly spaced apart. For example, in some embodiment, the spacing between adjacent laser diodes varies (e.g. increases or decreases) between the ends of the laser diode array.

In the above embodiments, the temperature deltas of each of the laser diodes are the substantially equal to each other. However, in other embodiments, the temperature deltas are not all equal.

In the above embodiments, the first temperature sensor is located at or proximate to an inlet of the laser diode array. However, in other embodiments the first temperature sensor has a different location, for example at or proximate to an outlet of the coolant circulation system.

In the above embodiments, the second temperature sensor is located at or proximate to an outlet of the laser diode array. However, in other embodiments the second temperature sensor has a different location, for example at or proximate to an inlet of the coolant circulation system.

In the above embodiments, the coolant flow rate is controlled based on measurements taken by the first and/or second temperature sensors. However, in other embodiments the coolant flow rate is controlled based on one or more other parameters instead of or in addition to the measurements taken by the first and/or second temperature sensors. For example, the temperature of the coolant may be measured at one or more points within the laser diode array (i.e. in the through channel). These one or more temperature measurements may be used to control the coolant flow rate. Also, in some embodiments, measurements of the radiation output by one or more of the laser diodes may be used to control the coolant flow rate.

In the above embodiments, each laser diode is powered by the same, common drive current. However, in other embodiments the drive current received by one or more of the laser diodes is different to the drive current received by one or more of the other laser diodes.

In the above embodiments, coolant is circulated through the laser diode array. However, in other embodiments, coolant is not circulated.

The invention claimed is:

1. A system comprising:
a laser diode array comprising;
a plurality of laser diodes; and
a channel proximate to each of the laser diodes, the channel being configured to receive and provide a passage for a flow of a fluid coolant, the channel comprising a coolant inlet into which the fluid coolant can flow, and a coolant outlet out of which the fluid coolant can flow, the laser diodes being spaced apart along the channel between the inlet and the outlet;
wherein each of the laser diodes is configured to emit electromagnetic radiation having the same centre wavelength as each of the other laser diodes, and each of the laser diodes is configured to emit the light at the centre wavelength at a different junction temperature to each of the other laser diodes;
a coolant supply system coupled to the laser diode array and configured to cause the fluid coolant to flow through the channel of the laser diode array;
a first temperature sensor configured to measure a first temperature of the fluid coolant at the coolant inlet; and
a second temperature sensor configured to measure a second temperature of the fluid coolant at the coolant outlet;
wherein the coolant supply system is configured to independently control the first temperature of the fluid coolant as measured by the first temperature sensor at the coolant inlet to be substantially equal to the junction temperature at which a first one of the laser diodes that is closest to the coolant inlet is configured to emit electromagnetic radiation at the centre wavelength; and
the coolant supply system is configured to independently control a flow rate of the fluid coolant to the laser diode array such that the second temperature of the fluid coolant as measured by the second temperature sensor at the coolant outlet is substantially equal to the junction temperature at which a second one of the laser diodes that is closest to the coolant outlet is configured to emit electromagnetic radiation at the centre wavelength.

2. The laser diode array according to claim 1, wherein the laser diodes are uniformly spaced apart.

3. The system according to claim 1, wherein temperature deltas for each respective laser diode are substantially equal to each other, a temperature delta for a laser diode being a difference between a casing temperature of that laser diode and a temperature of the fluid coolant at that laser diode.

4. A method for cooling a laser diode array, the method comprising;
providing a laser diode array comprising a plurality of laser diodes and a channel proximate to each of the laser diodes, the channel being configured to receive and provide a passage for a flow of a fluid coolant, the channel comprising a coolant inlet into which the fluid coolant can flow, and a coolant outlet out of which the fluid coolant can flow, the laser diodes being spaced apart along the channel between the inlet and the outlet, each of the laser diodes being configured to emit electromagnetic radiation having the same centre wavelength as each of the other laser diodes, each of the laser diodes being configured to emit the light at the centre wavelength at a different junction temperature to each of the other laser diodes,
causing, by a coolant supply system coupled to the laser diode array, a fluid coolant to flow through the channel of the laser diode array
measuring by a first temperature sensor of a first temperature of the fluid coolant at the coolant inlet;
measuring by a second temperature sensor of a second temperature of the fluid coolant at the coolant outlet;
independently controlling a temperature of the fluid coolant such that the first temperature as measured by the first temperature sensor at the coolant inlet is substantially equal to the junction temperature at which a first one of the laser diodes that is closest to the coolant inlet is configured to emit electromagnetic radiation at the centre wavelength; and
independently controlling a flow rate of the fluid coolant such that the second temperature as measured by the second temperature sensor at the coolant outlet is substantially equal to the junction temperature at which a second one of the laser diodes that is closest to the coolant outlet is configured to emit electromagnetic radiation at the centre wavelength.

5. The method of claim 4, wherein the laser diodes are uniformly spaced apart.

6. The method of claim 4, wherein temperature deltas for each respective laser diode are substantially equal to each other, a temperature delta for a laser diode being a difference between a casing temperature of that laser diode and a temperature of the fluid coolant at that laser diode.

\* \* \* \* \*